(12) United States Patent
Lin

(10) Patent No.: US 8,400,343 B1
(45) Date of Patent: Mar. 19, 2013

(54) PIPELINE ANALOG TO DIGITAL CONVERTER WITH SPLIT-PATH LEVEL SHIFTING TECHNIQUE

(75) Inventor: Jin-Fu Lin, Tainan (TW)

(73) Assignee: Himax Technologies Limited, Fonghua Village, Xinshi Dist., Tainan (TW)

( * ) Notice: Subject to any disclaimer, the term of this patent is extended or adjusted under 35 U.S.C. 154(b) by 43 days.

(21) Appl. No.: 13/276,287

(22) Filed: Oct. 18, 2011

(51) Int. Cl.
*H03M 1/38* (2006.01)

(52) U.S. Cl. ........ 341/161; 341/118; 341/120; 341/155; 341/172

(58) Field of Classification Search .................. 341/118, 341/120, 155, 161, 162, 172
See application file for complete search history.

(56) References Cited

U.S. PATENT DOCUMENTS

| | | | | |
|---|---|---|---|---|
| 5,675,340 | A * | 10/1997 | Hester et al. ................... | 341/156 |
| 6,124,818 | A * | 9/2000 | Thomas et al. ................. | 341/155 |
| 6,667,707 | B2 * | 12/2003 | Mueck et al. ................... | 341/172 |
| 6,914,550 | B2 * | 7/2005 | Cai ................................ | 341/155 |
| 7,583,211 | B1 * | 9/2009 | Wu ................................ | 341/120 |
| 7,609,185 | B2 * | 10/2009 | Kernahan et al. ............... | 341/120 |
| 7,728,752 | B2 * | 6/2010 | Ali et al. ........................ | 341/161 |
| 7,742,174 | B2 * | 6/2010 | Izatt et al. ...................... | 356/497 |
| 7,834,793 | B2 * | 11/2010 | Carreau et al. ................. | 341/155 |
| 7,986,253 | B2 * | 7/2011 | Cho et al. ....................... | 341/118 |
| 8,018,361 | B2 * | 9/2011 | Ranganathan et al. ........ | 341/122 |
| 8,188,902 | B2 * | 5/2012 | Mitikiri et al. ................. | 341/163 |
| 8,310,388 | B2 * | 11/2012 | Chang et al. ................... | 341/156 |

OTHER PUBLICATIONS

Chun C. Lee and Michael P. Flynn, "A 12b 50MS/s 3.5mW SAR Assisted 2-Stage Pipeline ADC", 2010.
Masanori Furuta, Mai Nozawa, Tetsuro Itakura, "A 0.06mm2 8.9b ENOB 40MS/s Pipelined SAR ADC in 65nm CMOS", 2010.
Simon M. Louwsma, "A 1.35 GS/s, 10 b, 175 mW Time-Interleaved AD Converter in 0.13 um CMOS", 2008.

* cited by examiner

*Primary Examiner* — Linh Nguyen
(74) *Attorney, Agent, or Firm* — Winston Hsu; Scott Margo

(57) ABSTRACT

A stage of a pipeline analog-to-digital converter (ADC) is provided according to embodiments of the present invention. The stage of the present invention has double-amplifier architecture and uses level-shifting technique to generate a residue of the stage. The amplifiers of the stage are implemented in two different split paths, thereby to generate a relatively coarse amplification result and a relative fine amplification result. The relatively coarse amplification result is used to level-shift the output level of the amplifier. As a result, the stage of the present invention can have a correct residual by using amplifiers of moderate quality.

15 Claims, 5 Drawing Sheets

PIPELINE ANALOG TO DIGITAL CONVERTER WITH SPLIT-PATH LEVEL SHIFTING TECHNIQUE

BACKGROUND OF THE INVENTION

1. Field of the Invention

The present invention relates generally to pipeline analog-to-digital converter, and more particularly, to a stage of a pipeline ADC, wherein the stage comprises two split paths and uses level-shifting technique to generate a residue.

2. Description of the Prior Art

An analog-to-digital converter (ADC) is an electronic device that converts an input analog voltage or current to a digital number proportional to the magnitude of the voltage or current. ADCs are used virtually everywhere where an analog signal has to be processed, stored, or transported in digital form. The ADC covers a wide range of applications, including music recording, computer data storage, video/audio processing, mobile communication, measurement system, and so on. The ADC can be implemented, as well known to one of ordinary skill in the art, in many different types, such as a flash ADC, a successive-approximation (SAR) ADC, a sigma-delta ADC, or a pipeline ADC. Generally, applications with lower sampling rates are still the domain of the successive approximation register (SAR) and more recently, sigma-delta ADCs. The highest sampling rates are still obtained using flash ADCs. Nonetheless, pipeline ADCs of various forms have improved greatly in speed, resolution, dynamic performance.

The pipeline ADC uses two or more steps of subranging. First, a coarse conversion is done based on an input analog signal. In a second step, the difference to the input analog signal is determined with a digital to analog converter (DAC). This difference is then converted finer, and the results are combined in a last step. An example of pipeline ADC can refer to the document of Chun C. Lee and Michael P. Flynn, entitled "A 12 b 50 MS/s 3.5 mW SAR Assisted 2-Stage Pipeline ADC", which is hereby incorporated by reference.

Please refer to FIG. 1, which illustrates the proposed pipeline ADC architecture of the abovementioned document. The Stage 1 of pipeline ADC 100 comprises a 6 bit SAR ADC 110 employed for a coarse conversion to generate a digital code $D_{OUT1}$ of 6 bits according to input signal $V_{IN}$ and the adder 120 determines a difference between the input signal $V_{IN}$ and the signal V1 proportional to the digital code $D_{OUT1}$. Accordingly, an amplifier 140 is employed for amplifying the difference to generate a residual signal $V_{RES}$ and a 7 bit SAR ADC 150 performs a fine conversion on the residual signal $V_{RES}$ to generate a digital code $D_{OUT2}$ of 7 bits. Finally, a digital error correction block 160 combines and corrects the digital code $D_{OUT1}$ and the digital code $D_{OUT2}$ for obtaining a digital code $D_{FINAL}$, which is the conversion result of the input signal $V_{IN}$. The architecture proposed uses a SAR ADC instead of the conventional flash ADC architecture, as a first stage. This eliminates all the drawbacks of a first stage of the flash ADC architecture. In more detail, this eliminate the dedicated sample and hold amplifier (SHA) which provide a stable held signal for flash ADC and MDAC in the first stage. Moreover, SAR ADC requires less power consumption and die area than flash ADC.

However, in the abovementioned architecture, since the first stage of the pipeline ADC 100 needs to resolve a large amount of bits (6 bits), the performance of the amplifier 140 is strictly demanded. For example, the bandwidth and the slew rate of the amplifier 140 should be large enough to make the difference between the input signal $V_{IN}$ and the signal V1 well-amplified, in order to make the residual signal $V_{RES}$ have a proper and exact scale. Only by doing so, the 7 bit SAR ADC 150 can correctly resolve the remaining bits, namely digital code $D_{OUT2}$. Hence, the amplifier 140 will affect the performance of the pipeline ADC 100.

In view of above, under the prior-art architecture, the performance of the amplifier 140 becomes a most significant bottleneck of the pipeline ADC 100. If the amplifier 140 is not well-designed, the pipeline ADC will get a poor performance.

SUMMARY OF THE INVENTION

With this in mind, it is one objective of the present invention to provide novel architecture of a stage of a pipeline ADC. In order to overcome the difficulties of designing the amplifier, the architecture of the inventive stage provides two different split paths, one of which provides a rough amplification result by an estimate amplifier while the other of which provides a finer amplification result by an output amplifier. The rough amplification result will be used to level-shift the output of the stage, and the rough amplification result will then be accordingly combined with finer amplification result to generate a correct residual of the stage. The double-amplifier design can amplify the residue to a desired level. Also, the designing of the amplifier will become much easier than a traditional single-amplifier design. Moreover, two feedback loops, which are performed from PMOS and NMOS of the amplifier, further enhance the DC gain, bandwidth, slew rate of amplifier.

According to one embodiment of the present invention, a stage of a pipeline analog-to-digital converter (ADC) is provided. The pipeline ADC comprises a successive-approximation-register (SAR) ADC, a sub capacitor array, an estimate amplifier, an output amplifier, and a feedback circuit. The SAR ADC includes a capacitor array, and is employed for converting an input analog signal to a digital code and accordingly generating a first residual signal from an output of the capacitor array, wherein the capacitor array is controlled by the digital code. The sub capacitor array is employed for generating a second residual signal from an output of the sub capacitor array by the digital code, wherein the capacitor array and the sub capacitor array samples the input analog signal before the digital code is obtained. The estimate amplifier is employed for generating an estimate signal according to the second residual signal. The output amplifier is employed for generating an third residual signal according to the first residual signal and the second residual signal. The feedback circuit is employed for storing the estimate signal during an estimate phase and generating an output residual signal during a level-shifting phase according to the first residual signal, the second residual signal, and the third residual signal.

According to another embodiment of the present invention, a stage of a pipeline ADC is provided. The stage of the pipeline ADC comprises a SAR ADC, an estimate amplifier, an output amplifier, and a feedback circuit. The SAR ADC includes a capacitor array, and is employed for converting an input analog signal to a digital code and accordingly generating a first residual signal from an output of the capacitor array, wherein the capacitor array is controlled by the digital code. The estimate amplifier is employed for generating an estimate signal according to the first residual signal. The output amplifier is employed for generating a second residual signal according to the first residual signal. The feedback circuit is employed for storing the estimate signal during an estimate phase and generating an output residual signal during a level-shifting phase according to the first residual signal and the second residual signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following descriptions and claims to refer to particular system components. As one skilled in the art will appreciate, manufacturers may refer to a component by different names. This document does not intend to distinguish between components that differ in name but not differ in functionality. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

Figure 2:
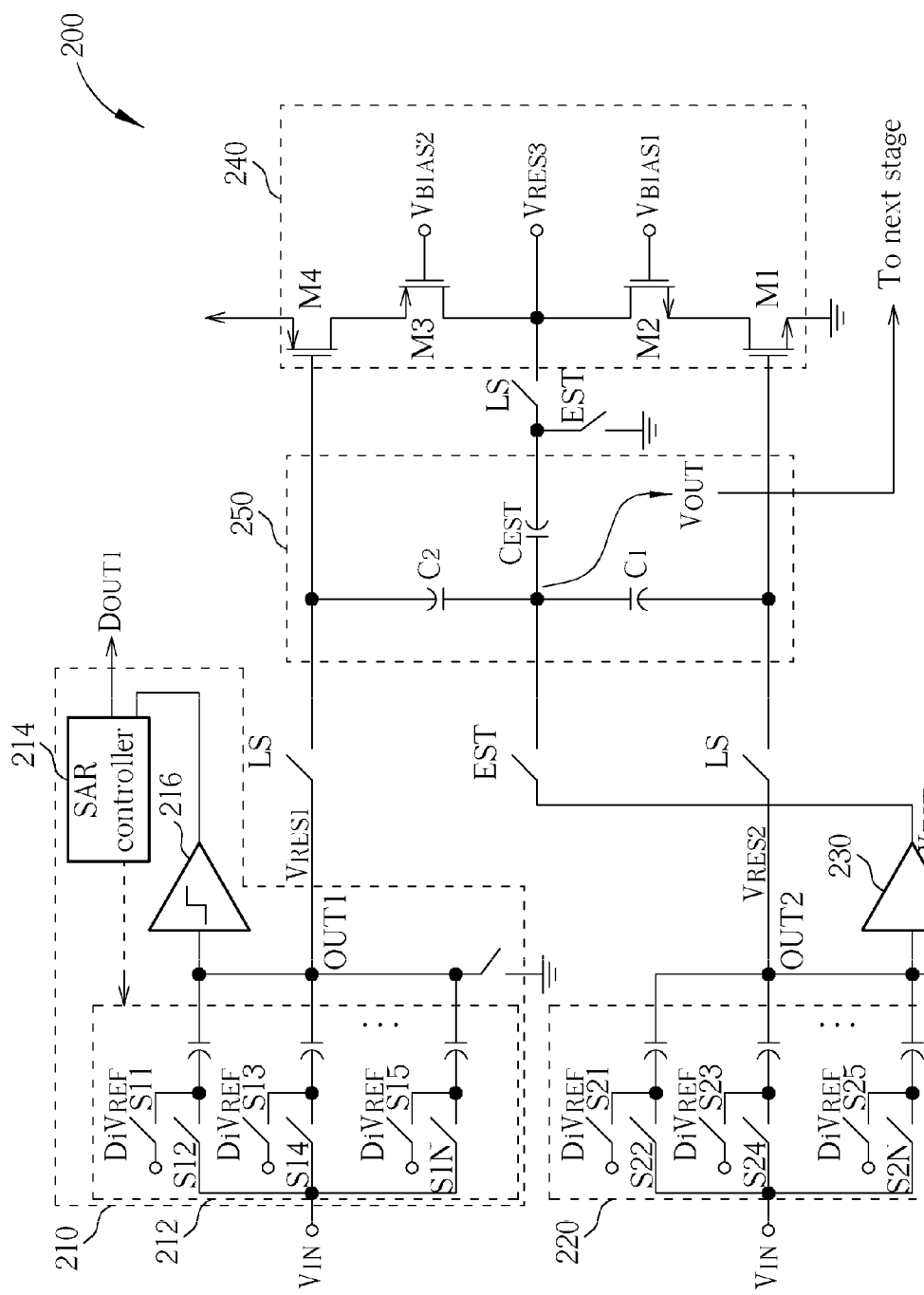
FIG. 2 shows a circuit diagram of a stage of a pipeline ADC according to one exemplary embodiment of the present invention.

With reference FIG. 2, a circuit diagram of a stage 200 of a pipeline ADC is illustrated according to one exemplary embodiment of the present invention. As shown in FIG. 2, the stage 200 of the pipeline ADC comprises a successive-approximation-register (SAR) ADC 210, a sub capacitor array 220, an estimate amplifier 230, an output amplifier 240 and a feedback circuit 250. Preferably, the stage 200 can act as a first stage of the pipeline ADC, to resolve a portion of bits of a digital code corresponding to an input signal $V_{IN}$. Similar to most of pipeline ADC, the stage 200 operates by turns in different phases, including a sample phase, a SAR phase, an estimate phase, and a level-shifting phase as shown in timing sequence (b) of FIG. 3.

The SAR ADC 210 includes a capacitor array 212, a SAR controller 214, and a comparator 216. Please note that the stage 200 may be a positive (or negative) part of a differential architecture, and the negative (or positive) part is omitted here. However, operations of the negative part are similar to the following descriptions. Besides, it is also possible the stage 200 is just a single-ended architecture. The capacitor array 212 is employed for sampling and holding the input signal $V_{IN}$ to be converted during the sample phase. Following the sample phase, the capacitor array 212, the SAR controller 214 and comparator 216, operate in combination, for resolving a corresponding digital code $D_{OUT1}$ according to the input signal $V_{IN}$ in the SAR phase. The way how the SAR controller 214 and comparator 216 convert an analog signal to a digital signal is involved with the principle of SAR ADC and is omitted here for the sake of brevity. It should be noted that if the stage 200 is a differential architecture, the comparator 216 will compares the output voltage of the capacitor array 212 with a corresponding voltage of the capacitor array of the other part (not shown). If the stage 200 is a single-ended architecture, the comparator 216 may compare the voltage of the capacitor array 212 with a reference voltage.

Figure 1:
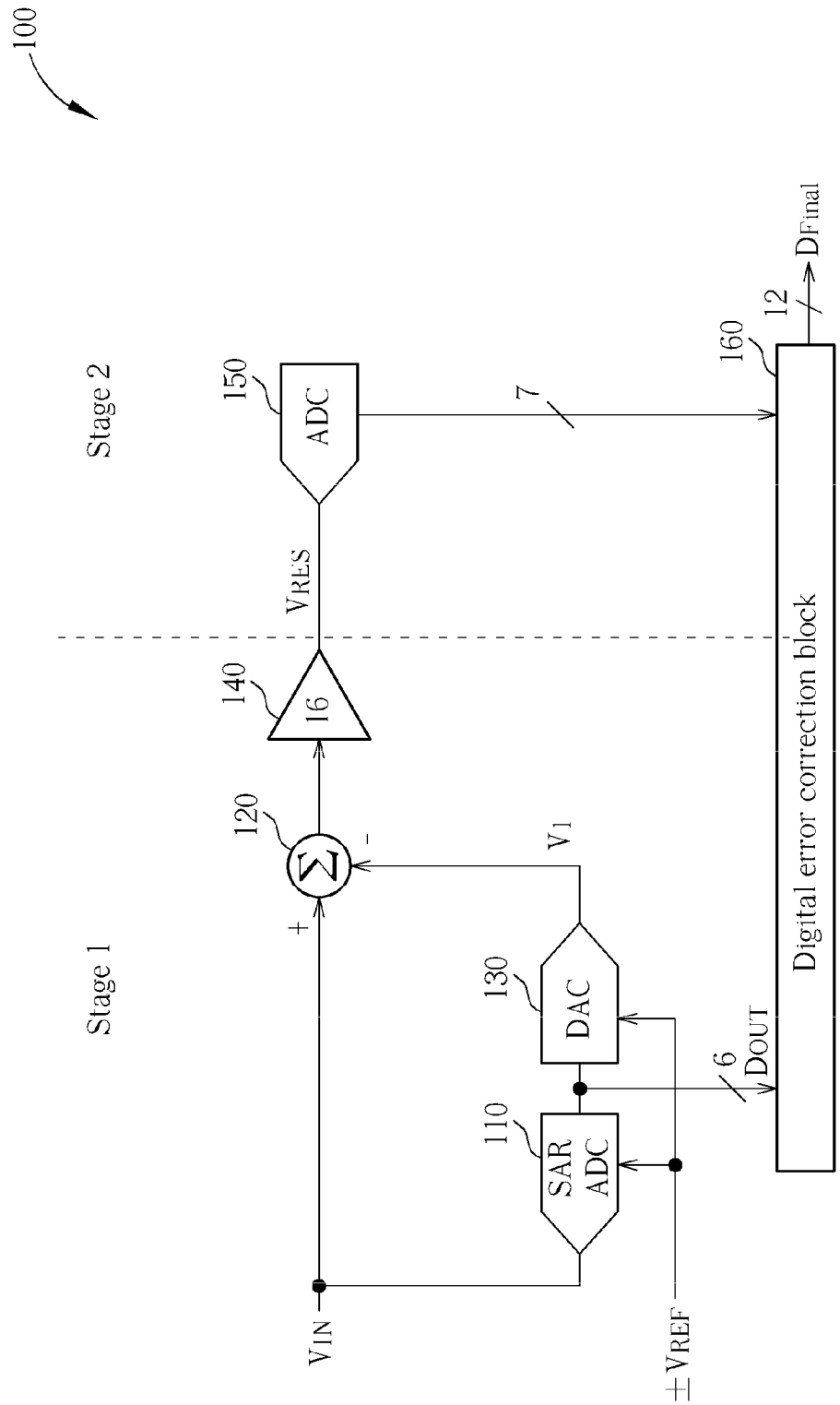
FIG. 1 shows a circuit diagram of a traditional pipeline ADC.

Once the digital code $D_{OUT1}$ is resolved, a first residual signal $V_{RES1}$ will be subsequently generated at an output OUT1 of the capacitor array 212 by configuring ON/OFF states of the switches S11-S1N according to the digital code $D_{OUT1}$. With the switches S11-S1N, the capacitor array 212 can act as a capacitive DAC (like the DAC 130 of FIG. 1) and an adder (like the adder 120 of FIG. 1) to provide a first residual signal $V_{RES1}$. By this way, the first residual signal $V_{RES1}$ representing a difference between the input signal $V_{IN}$ and a signal corresponding to the digital code $D_{OUT1}$ can be derived from an output OUT1 of the capacitor array 212.

The sub capacitor array 220 is used for deriving a second residual signal $V_{RES2}$, which also represents the difference between the input signal $V_{IN}$ and a signal corresponding to the digital code $D_{OUT1}$. The sub capacitor array 220 samples the input analog signal $V_{IN}$ (during sample phase) before the digital code $D_{OUT1}$ is obtained (during the SAR phase). After the digital code $D_{OUT1}$ is obtained, the ON/OFF states of the switches S21-S2N is accordingly configured by the SAR controller 214 such that the second residual signal $V_{RES2}$ will be generated from an output OUT2 of the sub capacitor array 220. It is noted that the input analog signal $V_{IN}$ is sampled in the sub capacitor arrays 210 and 220 through the switches (i.e., S1N and S2N, where N is even number) during the sampling phase and each capacitor of the sub capacitor arrays 210 and 220 are switched to one of a plurality of reference voltages DiVREF (such as Vref+, Vcm, and Vref-) through the switches (i.e., S1N and S2N, where N is odd number).

The sub capacitor array 220 and the sub capacitor array 212 operate simultaneously. They both follow the DAC switching scheme of SAR ADC 210. The first residual signal $V_{RES1}$ and the second residual signal $V_{RES2}$ are ready at the same time. The estimate amplifier 230 amplifies the second residual signal $V_{RES2}$ as an estimate signal $V_{EST}$. Be noted that the capacitors of the capacitor array 212 and the sub capacitor array 220 should be weighted in the same manner (for example, both are binary-weighted) but a total capacitance of the capacitors of the capacitor array 212 and a total capacitance of the capacitors of the sub capacitor array 220 may be identical or different. As a result, the first residual signal $V_{RES1}$ and the second residual signal $V_{RES2}$ is substantially the same since the switches 11-1N and 21-2N are configured according to the same digital code $D_{OUT1}$. If the total capacitance of the sub capacitor array 220 is smaller than the total capacitance of the capacitor array 212, the size of the sub capacitor array 220 will be smaller, thereby to reduce the size of the stage 200. The output amplifier 240 also generates an third residual signal $V_{RES3}$ according to the first residual signal $V_{RES1}$ and the second residual signal $V_{RES2}$. Finally, the feedback circuit 250 generates the output residual signal $V_{OUT}$ according to the first residual signal $V_{RES1}$, the second residual signal $V_{RES2}$, and the third residual signal $V_{RES3}$, and the estimate signal $V_{EST}$. The output residual signal $V_{OUT}$ will be referred to as the output of the stage 200, and be forwarded to a next stage of the pipeline ADC. In other words, the output residual signal $V_{OUT}$ can be considered as $V_{RES}$ shown in FIG. 1.

Referring again to FIG. 2, stage 200 comprises a plurality of switches, wherein the switches further includes a plurality of estimate-phase controlled switches and a plurality of level-shifting-phase controlled switches, which are respectively controlled by control signals having non-overlapped phases. During the estimate phase of stage 200, the estimate-phase controlled switches labeled with "EST" will become conductive. During the level-shifting phase of stage 200, the level-shifting-phase controlled switches labeled with "LS" will become conductive, thereby to control the operation of the feedback circuit 250. The feedback circuit 250 comprises an estimate capacitor $C_{EST}$, first capacitor C1 and second capacitor C2, wherein the connections there between these elements are illustrated in FIG. 2. During the estimate phase, the "EST" switches are conductive, and the estimate signal $V_{EST}$, generated by the amplifier 230 will be stored by the capacitor $C_{EST}$. During the level-shifting phase, the "LS" switches are conductive, and the output of the amplifier 240 will be shifted by the estimate signal $V_{EST}$ and the output amplifier 240 also amplifies the first residual signal $V_{RES1}$ and the second residual signal $V_{RES2}$, to generate the third residual signal $V_{RES3}$. The output residual signal $V_{OUT}$ is derived from a summation of the third residual signal $V_{RES3}$ and the estimate signal $V_{EST}$ stored in the capacitor $C_{EST}$.

Figure 5:
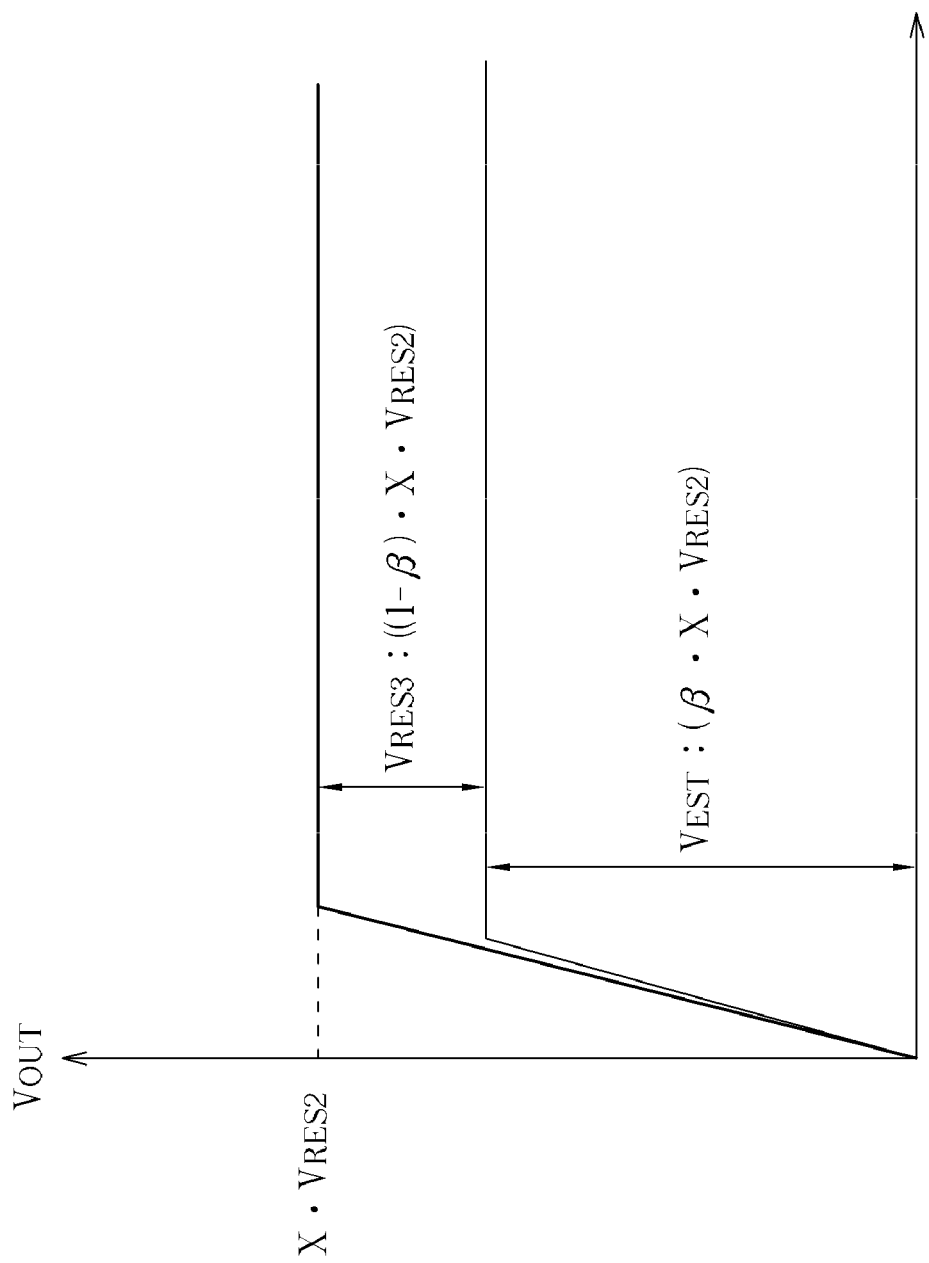
FIG. 5 shows a relationship between an estimate signal, a residual signal and a output residual signal.

The estimate amplifier 230 is operated in an open loop configuration. If the desired level of the output residual $V_{OUT}$ should be X times (e.g., 16) as large as the first residual signal $V_{RES1}$ generated by the SAR ADC 210, the second residual signal $V_{RES2}$ will be amplified by a factor close to X, during the estimate phase. That is, the estimate signal $V_{EST}$ will be $\beta * X * V_{RES2}$, wherein $\beta$ is smaller than 1 and very close to 1 due to the imperfection of the open loop configuration. During the level-shifting phase, as the feedback circuit 250 and the output amplifier 240 forms a closed loop configuration, the output residual signal $V_{OUT}$ can be controlled to the desired level, $X * V_{RES2}$, and the third residual signal $V_{RES3}$ will be $(1-\beta) * X * V_{RES2}$. The relationship there between is expressly illustrated in FIG. 5.

An advantage of the present invention is to make the designer can easily design the estimate amplifier 230 and the output amplifier 240. As the estimate amplifier 230 is operated in an open loop configuration, the estimate amplifier 230 is easy to design. Also, as the output level of the output amplifier 240 is previously shifted to a voltage level $\beta * X * V_{RES2}$, which is very close to the desired level $X * V_{RES2}$. Therefore, the third residual signal $V_{RES3}$ generated by the output amplifier 240 only has small signal swing. Therefore, it is also much easier to design the output amplifier 240 than to design the amplifier 140 of the prior art.

Because the first residual signal $V_{RES1}$ and the second residual signal $V_{RES2}$ are respectively connected to inputs M1 and M4 of amplifier 240, two feedback loops are performed. This implementation make amplifier become a class-AB type. This can further enhance the DC gain, bandwidth, slew rate.

It should be noted the stage 200 is illustrated as a first stage of the pipeline ADC for illustrative purposes only. According to other embodiments of the present invention, the stage 200 may be served as an intermediate stage (e.g. $2^{ND}$ Stage, $3^{rd}$ Stage ... ) of the pipeline ADC.

Figure 3:
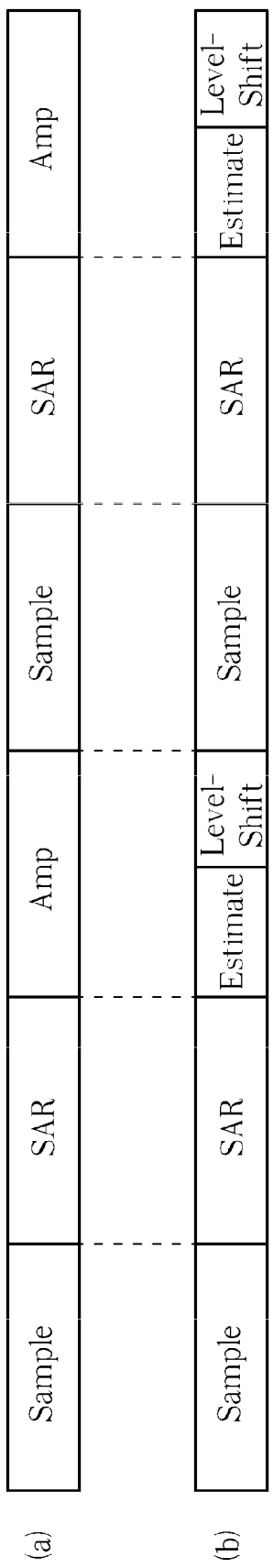
FIG. 3 shows timing sequences of operational phases of a stage of a traditional pipeline ADC and an inventive stage of the pipeline ADC according to one embodiment of the present invention.

Please refer to FIG. 3. As shown in FIG. 3, the timing sequence (a) illustrates operating phases of a stage of the traditional pipeline ADC, including sample, SAR (namely decoding), and amplify phases. As mentioned above, the input analog signal will be sampled and hold during the sample phase. During the SAR (or decoding) phase, the SAR logic (or ADC logic) of the stage resolves the input signal to generate the digital code. Then the residual signal is be amplified and sent to a next stage of the pipeline ADC during the amplify stage. The level-shifting phase and the estimate phase of the stage 200 are exactly included within the period of the traditional amplify phase. Therefore the architecture of the stage 200 can be perfectly applied to or modify any traditional pipeline ADC.

Figure 4:
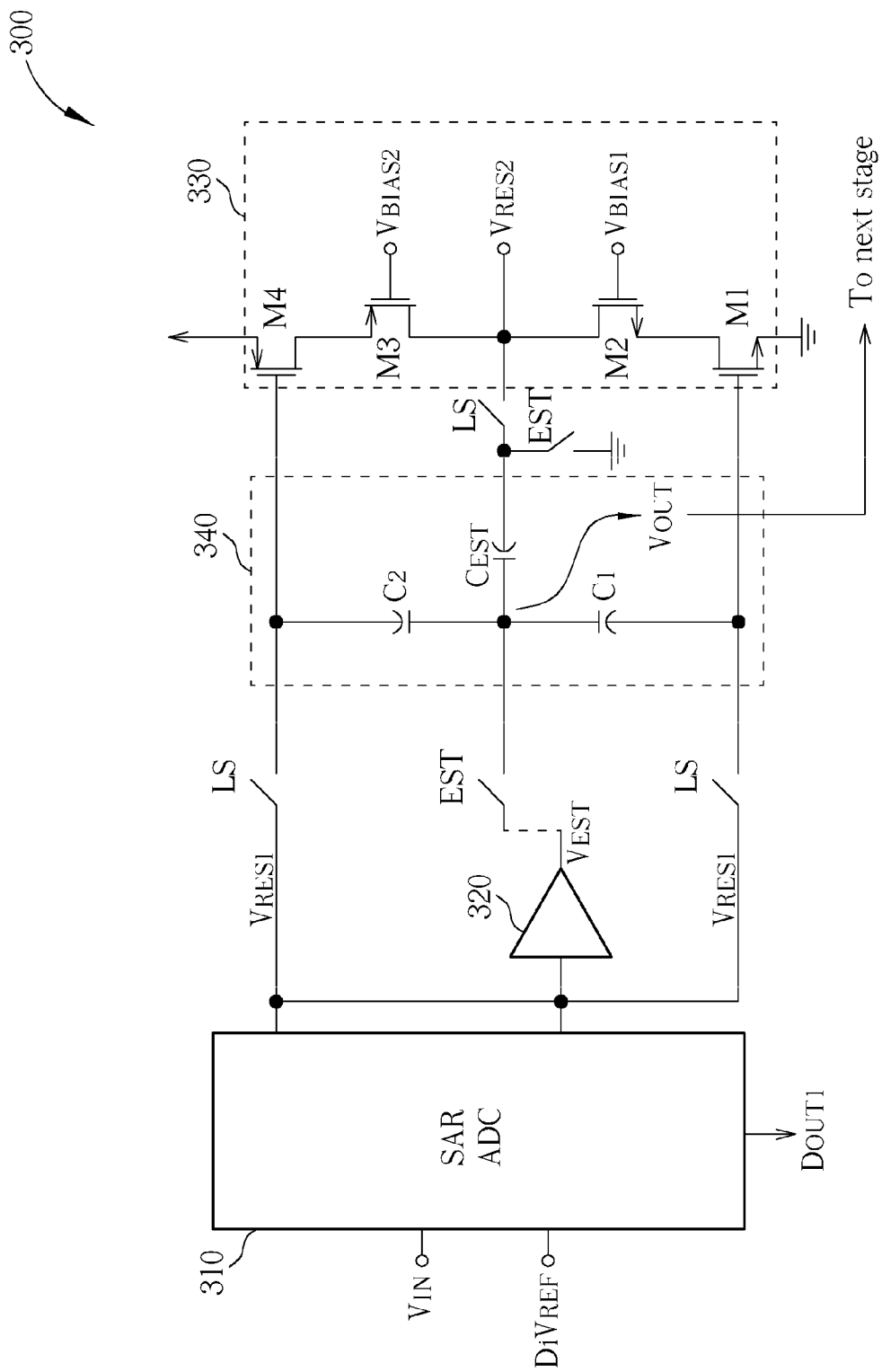
FIG. 4 shows a circuit diagram of a stage of a pipeline ADC according to another exemplary embodiment of the present invention.

According to alternative implementations, the architecture of the stage can be further simplified due to the similarity of the first residual signal $V_{RES1}$ and $V_{RES2}$. Please refer to FIG. 4, which illustrates a circuit diagram of the inventive stage according to another exemplary embodiment. As shown in FIG. 4, the stage 300 comprises a successive-approximation-register (SAR) ADC 310, an estimate amplifier 320, an output amplifier 330 and a feedback circuit 340. The stage 300 can act as any stage, except the last stage, of the pipeline ADC to resolve a portion of bits of the input signal $V_{IN}$.

The SAR ADC 310 has the architecture same as that of SAR ADC 210 and operations of the SAR ADC 310 is also the same as those of SAR ADC 210. The SAR ADC 310 samples the input signal $V_{IN}$ in the sample phase and resolves a corresponding digital code $D_{OUT1}$ according to the input signal $V_{IN}$ in the SAR phase. Once the digital code $D_{OUT1}$ is resolved, a first residual signal $V_{RES1}$ will be subsequently generated by the capacitor array of the ADC 310. In this embodiment, the sub capacitor array 220, shown in FIG. 2, is omitted for circuitry simplicity. Therefore, the estimate amplifier 320 generates the estimate signal $V_{EST}$ according to the first residual signal $V_{RES1}$. During the estimate phase, the estimate signal $V_{EST}$ is stored in capacitor $C_{EST}$. Afterward, when the level-shifting phase is entered, the output amplifier 330 amplifies the first residual signal $V_{RES1}$ to generate a second residual signal $V_{RES2}$ and the level of the second residual signal $V_{RES2}$ will be shifted by the estimate signal $V_{EST}$ as the output residual signal $V_{OUT}$. Finally, the feedback circuit 340 makes the output residual signal $V_{OUT}$ equal to the summation of the second residual signal $V_{RES2}$ and the estimate signal $V_{EST}$. The output residual signal $V_{OUT}$ will be referred to as a residue of the stage 300, and be forwarded to a next stage of the pipeline ADC. In addition, the stage 300 also comprises a plurality of switches respectively controlled by control signals having non-overlapped phases, which are controlled similar to those of stage 200.

In this implementation, due to the similarity of the first residual signal $V_{RES1}$ and the second residual signal $V_{RES2}$ (as mentioned above, they are generated by the capacitor arrays having the same weighting), the first residual signal $V_{RES1}$ is used in replace of the second residual signal $V_{RES2}$ and the sub capacitor array 220 is omitted. Therefore, the circuit complexity can be reduced.

In view of above, the present invention provides a stage of a pipeline analog-to-digital converter (ADC). To overcome the difficulties of designing an amplifier used for amplifying the residual under the prior-art architecture, the present invention proposes novel double-amplifier architecture to amplifying the residual of the stage. The amplifiers of the stage are disposed in two different split paths, thereby to generate a relatively coarse amplification result in advance. Then a relative fine amplification result to make up for the coarse amplification result. As a result, the stage of the present invention can derive a correct residual by using moderate quality amplifiers. If the manufacturer or designer adopts the architecture of the present invention into the pipeline ADC, the design of the amplifier can be eased.

Those skilled in the art will readily observe that numerous modifications and alterations of the device and method may be made while retaining the teachings of the invention.

What is claimed is:

1. A stage of a pipeline analog-to-digital converter (ADC), comprising:
   a successive-approximation-register (SAR) ADC including a capacitor array, for converting an input analog signal to a digital code and accordingly generating a first residual signal from an output of the capacitor array, wherein the capacitor array is controlled by the digital code;
   a sub capacitor array, for generating a second residual signal from an output of the sub capacitor array by the digital code, wherein the capacitor array and the sub capacitor array samples the input analog signal before the digital code is obtained;
   an estimate amplifier, for generating an estimate signal according to the second residual signal;
   an output amplifier, for generating an third residual signal according to the first residual signal and the second residual signal; and
   a feedback circuit, for storing the estimate signal during an estimate phase and generating an output residual signal during a level-shifting phase according to the first residual signal, the second residual signal, and the third residual signal.

2. The stage of the pipeline ADC of claim 1, wherein the feedback circuit comprises:
   an estimate capacitor for storing the estimate signal controllably;
   a first capacitor, coupled to the estimate capacitor and a first input of the output amplifier; and
   a second capacitor, coupled to the estimate capacitor and a second input of the output amplifier.

3. The stage of the pipeline ADC of claim 2, wherein during the estimate phase, the estimate capacitor stores the estimate signal via a plurality of estimate-phase controlled switches.

4. The stage of the pipeline ADC of claim 3, wherein during the level-shifting phase, the estimate capacitor feeds an inversed estimate signal to an output of the output amplifier via one of a plurality of level-shifting-phase controlled switches.

5. The stage of the pipeline ADC of claim 3, wherein during the level-shifting phase, the output amplifier is operated in a closed loop configuration with the feedback circuit, where:
   the capacitor array forwards the first residual signal to the first input of the output amplifier via one of the plurality of first level-shifting-phase controlled switches; and
   the sub capacitor array forwards the second residual signal to the second input of the output amplifier via one of the plurality of second level-shifting-phase controlled switches.

6. The stage of the pipeline ADC of claim 1, wherein the estimate amplifier is operated in an open-loop configuration.

7. The stage of the pipeline ADC of claim 1, wherein a total capacitance of the capacitor array is greater than or equal to a total capacitance of the sub capacitor array.

8. The stage of the pipeline ADC of claim 1, wherein the output amplifier is a class AB amplifier.

9. A stage of a pipeline analog-to-digital converter (ADC), comprising:
   a successive-approximation-register (SAR) ADC including a capacitor array, for converting an input analog signal to a digital code and accordingly generating a first residual signal from an output of the capacitor array, wherein the capacitor array is controlled by the digital code;
   an estimate amplifier, for generating an estimate signal according to the first residual signal;
   an output amplifier, for generating an second residual signal according to the first residual signal; and
   a feedback circuit, for storing the estimate signal during an estimate phase and generating an output residual signal during a level-shifting phase according to the first residual signal and the second residual signal.

10. The stage of the pipeline ADC of claim 9, wherein the feedback circuit comprises:
    an estimate capacitor for storing the estimate signal controllably;
    a first capacitor, coupled to the estimate capacitor and a first input of the output amplifier; and
    a second capacitor, coupled to the estimate capacitor and a second input of the output amplifier.

11. The stage of the pipeline ADC of claim 10, wherein during the estimate phase, the estimate capacitor stores the estimate signal via a plurality of estimate-phase controlled switches.

12. The stage of the pipeline ADC of claim 11, wherein during the level-shifting phase, the estimate capacitor feeds an inversed estimate signal to an output of the output amplifier via one of a plurality of level-shifting-phase controlled switches.

13. The stage of the pipeline ADC of claim 11, wherein during the level-shifting phase, the output amplifier is operated in a closed loop configuration with the feedback circuit, where:
    the capacitor array forwards the first residual signal to the first input of the output amplifier via one of the plurality of first level-shifting-phase controlled switches; and
    the capacitor array forwards the first residual signal to the second input of the output amplifier via one of the plurality of second level-shifting-phase controlled switches.

14. The stage of the pipeline ADC of claim 9, wherein the estimate amplifier is operated in an open-loop configuration.

15. The stage of the pipeline ADC of claim 9, wherein the output amplifier is a class AB amplifier.

* * * * *